United States Patent [19]
Hansen

[11] 4,162,408
[45] Jul. 24, 1979

[54] OPTICAL MARK SENSE DETECTOR

[75] Inventor: Emmert S. Hansen, Slater, Iowa

[73] Assignee: Bourns, Inc., Riverside, Calif.

[21] Appl. No.: 842,656

[22] Filed: Oct. 17, 1977

[51] Int. Cl.$^2$ .............................................. G06K 7/10
[52] U.S. Cl. .................................... 250/555; 35/48 B;
340/146.3 AG
[58] Field of Search ............... 250/555, 566; 235/487,
235/454, 455, 458; 340/146.3 AG; 35/48 B

[56] References Cited
U.S. PATENT DOCUMENTS

| | | | |
|---|---|---|---|
| 3,675,201 | 7/1972 | McKissick | 340/146.3 AG |
| 3,692,982 | 9/1972 | McMillin | 340/146.3 AG |
| 3,692,983 | 9/1972 | Cucciati | 340/146.3 AG |
| 3,944,977 | 3/1976 | Holmes | 340/146.3 AG |
| 3,983,364 | 9/1976 | Firehammer | 35/48 B |

*Primary Examiner*—M. Tokar
*Attorney, Agent, or Firm*—Paul H. Ware; William G. Becker

[57] ABSTRACT

Apparatus for detecting marks or other objects by comparing a decrease in reflected light while the mark or object is moving across optics, to the light reflected before the mark or object was encountered by the optics. A threshold reference voltage level is derived directly from the conductance level of a phototransistor prior to the introduction of the mark or object to be detected. This reference level is developed in such a manner as to cause it to be a dynamic voltage, varying percentage-wise as the conductance of the photo-transistor. The dynamic reference level so determined is thus always directly a portion of the level present before the mark or object to be sensed was introduced.

10 Claims, 6 Drawing Figures

OPTICAL MARK SENSE DETECTOR

BACKGROUND OF THE INVENTION

1. Field of the Invention

This invention relates generally to optical mark detecting systems and more particularly to such systems as are used to sense pencil marks or objects on a document.

2. Description of the Prior Art

Optical mark sense detection systems are well-known in which data in the form of pencil marks on documents are recognized by a decrease in transmitted or reflected light when such a mark is encountered. In a typical prior art system, the method used to detect pencil marks on a document might be described as follows. Light from a high intensity source may be directed to the document by means of fiber optics. Light reflected from the document, such as a white or near-white paper material, may be received by other fiber optics and directed to the light-sensitive area of a photo-transistor circuit. A load resistor in that circuit will develop a voltage as a result of the conduction of the photo-transistor, which voltage is a function of the amount of light reflected from the document. If now a pencil mark is encountered by the optics, there will be a decrease in reflected light due to the decreased reflectance of the mark from the plain unmarked document. That is to say, a pencil mark does not reflect light as well as a white or near-white unmarked document. In these prior art devices a voltage threshold was set on a comparator and if, upon comparison, the voltage developed by the photo-transistor decreased below that threshold, the change in the comparator's output would be an indication of a sensed mark. Thus, light directed to a sensor causes the circuit to conduct current as a function of the amount of light received by the sensor. A reference or threshold level is applied to one input of a comparator while the conduction level of the circuit is applied to its other input. When the circuit conduction level is high, the output of the comparator will indicate no mark or object is present. When an object or mark passes the sensor and decreases the circuit conduction to a point equal to or lower than the reference or threshold level, the output of the comparator will change, thus indicating that a mark or object was detected.

One popular prior art system employs a fixed reference or threshold level. If, for example, this reference level is set at 6 volts when conduction in the circuit drops from, say, 10 volts to 6 volts, the system will indicate that a mark or object has been detected. Thus a 40% decrease in conduction has been necessary to cause this system to indicate detection of a mark or object.

Another prior art system has employed a fixed amount of voltage drop from an original voltage level. If, for example, this system has been set to detect a 4 volts drop from an original conduction level of again, say, 10 volts, the reference will again be set to 10 volts minus 4 volts=6 volts, thus again, a 40% decrease in conduction is required to cause this system to indicate detection of a mark or object.

It is interesting and instructive to examine both of these prior art systems under new conditions commonly encountered in the art so as to point up deficiencies and areas in need of improvement in such prior art systems. In the interest of specificity, assume that the intensity of the light source has decreased from any causes whatsoever such as, for example, decrease in supply voltage, aging, or the like. Assume further that this decrease in light intensity results in a decrease in conduction with no mark or object present from 10 volts down to, say, 8 volts.

Our first prior art system will still have the fixed reference or threshold voltage of 6 volts. It now requires, however, only a 2 volt drop in conduction to cause that system to indicate detection of a mark or object. This is only a 25% decrease in conduction. This increase in sensitivity may be enough to cause the system to indicate the presence of a mark or object when, in fact, none is present.

In the other prior art system considered, in which a specified voltage drop is required, we still require a 4 volt drop for the system to indicate detection of a mark or object. This requirement is now for a 50% drop in conduction from the 8 volts conduction with no mark or object present. This decrease in sensitivity may be intolerable in the system thus described.

Some of these prior art devices have been described in the below listed patents that were brought to the attention of applicant's attorney. It is hoped that this information may be of some help to the Examiner:

1. U.S. Pat. No. 3,600,558—"Coded Card and Reading Means"—Grosbard
2. U.S. Pat. No. 3,639,729—"Data Reading Apparatus'-'—Marshall
3. U.S. Pat. No. 3,639,730—"Optical Reader System'-'—Higginbotham et al.
4. U.S. Pat. No. 3,820,068—"Background Reference Level System and Method for Document Scanners'-'—McMillin
5. U.S. Pat. No. 3,870,865—"Method and Apparatus for Optical Reading of Recorded Data"—Schneiderhan et al.
6. U.S. Pat. No. 3,894,216 —"Illumination and Sensor Arrangement for Card Reader"—Bottles
7. U.S. Pat. No. 3,896,294 —"Plural Mode Card Reading Apparatus"—Schisselbauer et al.
8. U.S. Pat. No. 3,904,110—"Large Mark Tolerance Card Reader"—Bottles It would thus be a great advantage to the art to provide a system in which the reference threshold level is dynamically varied so as to maintain a constant sensitivity under some adverse conditions commonly encountered in such optical mark sense detection systems.

Another great advantage to the art would be the provision of a method of optical detecting by an optical system wherein the reference level is always directly a portion of the level before the object or mark to be sensed was present.

A further desirable advantage to the art would be the provision of a system in which the conduction level in the absence of marks or objects is constantly monitored and stored in a manner by which the stored level increases immediately with any increase in conduction but decreases very slowly when conduction decreases.

Yet another advantage to the art would be a system wherein a preset portion or percentage of the stored level of conduction is used as a reference or threshold to compare to a sensed level of conduction that is not being stored.

SUMMARY OF THE INVENTION

It is thus an object of the present invention to provide a system in which the reference threshold level is dynamically varied so as to maintain a constant sensitivity under adverse conditions commonly encountered in optical systems of mark sense detection devices.

It is still another object of the present invention to provide a method of optical detection wherein a reference level is always directly a portion of a level set before the object or mark to be sensed was present.

An additional object of the present invention is the provision of a system in which the conduction level in the absence of marks or objects is constantly monitored and stored in a manner by which the stored level increases immediately with any increase in conduction, but decreases very slowly when conduction decreases.

A still further object of the present invention is the provision of a system wherein a preset portion or percentage of the stored level of conduction may be used as a reference or threshold to compare to a sensed level of conduction that is not being stored.

In the accomplishment of these and other objects, an optical mark sense detector is provided in which a conduction level is constantly monitored and is stored in a manner by which the stored level increases immediately with any increase in conduction but decreases very slowly with any actual conduction decreases. This means that during times of decreased conduction due to passing by the sensor of objects or marks to be detected, the stored level of conduction will remain at whatever level it was just prior to that period of time. A preset portion or percentage of the stored level of conduction is thus used as a reference or threshold to compare to the actual level of conduction that is not being stored. The reference or threshold level is applied to one input of a comparator while the instant conduction level is applied to the other input of the comparator. When the instant conduction level is high, the output of the comparator will indicate no object or mark is present. When an object or mark passes the sensor and decreases the actual conduction to a point equal to or lower than the threshold reference, the output of the comparator will change to indicate that a mark or object has been detected. The methods of the invention provide the ability to dynamically vary the threshold level so that the same percent of decrease in conduction is always required in order to indicate detection of a mark or object.

BRIEF DESCRIPTION OF THE DRAWINGS

Further advantages and features of the present invention will be more fully apparent to those skilled in the art to which the invention pertains from the ensuing detailed description thereof, regarded in conjunction with the accompanying drawings wherein like reference characters refer to like parts throughout, and in which.

DETAILED DESCRIPTION

Although specific embodiment of the invention will now be described with reference to the drawings, it should be understood that such embodiments are by way of example only and merely illustrative of but a small number of the many possible specific embodiments which can represent applications of the principles of the invention. Various changes and modifications obvious to one skilled in the art to which the invention pertains are deemed to be within the spirit, scope, and contemplation of the invention as further defined in the appended claims.

Figure 1:
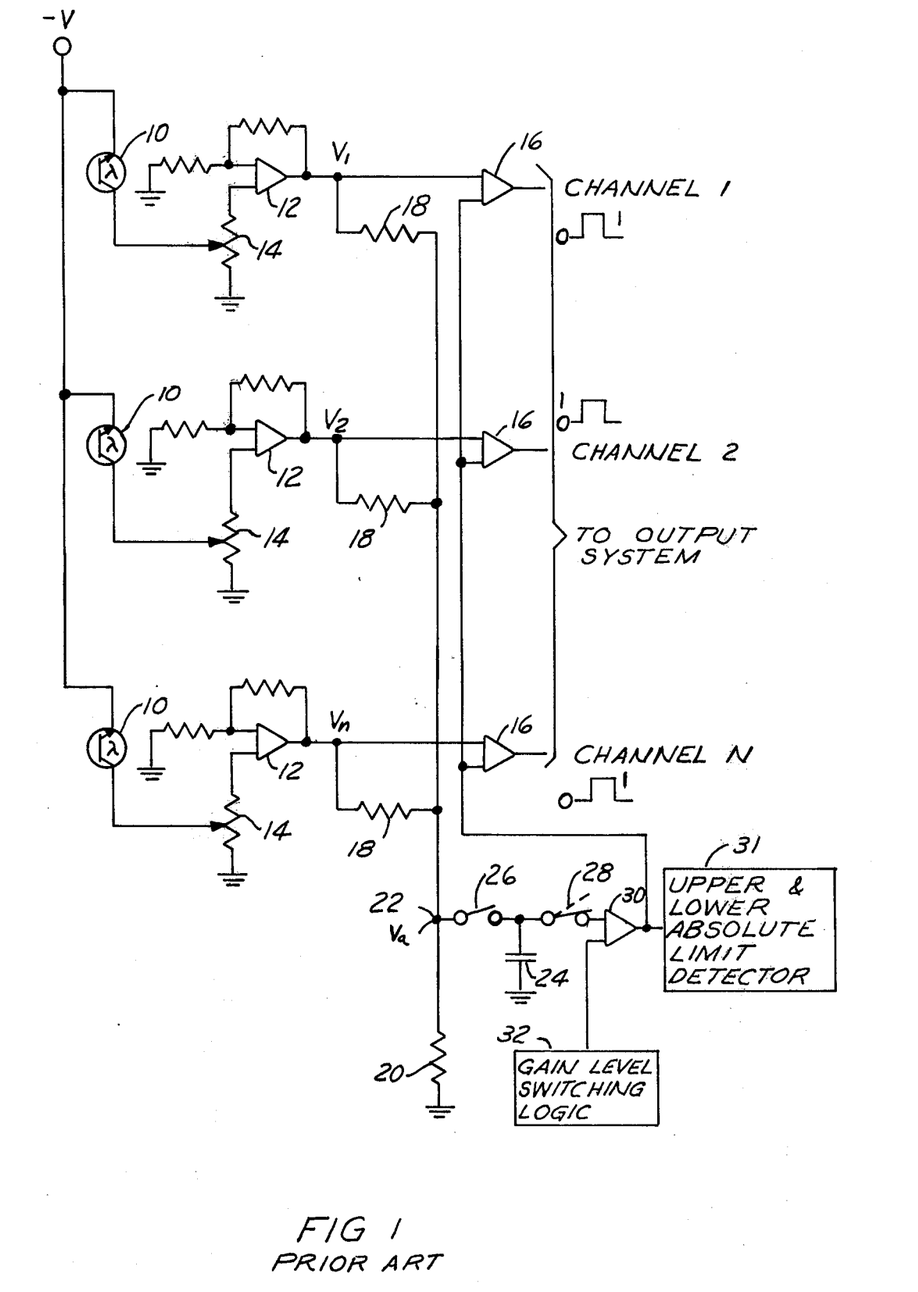
FIG. 1 is a schematic diagram of a prior art system in which signal output of sensing channels are averaged to arrive at a background level which is then used as a reference or threshold level for determining the presence of a mark or object.

Referring to FIG. 1 with greater particularity, there is shown a prior art device as has been described in U.S. Pat. No. 3,820,068 to McMillin of June 25, 1974.

Three channels of an N-channel matrix are shown in which each channel is identical to the others. Our description will thus be limited to one channel thereof. Light incident upon photo-transistor 10 causes conduction therein. The output from transistor 10 causes a voltage to be developed across potentiometer 14 and thence to operational amplifier 12. It is a feature of this prior art device that amplifiers 12 are the linear gain type and the potentiometer 14 in each channel is adjusted so that the input to each amplifier 12 is the same when the photo-transistors 10 sense the same amount of light intensity. Light detected by photo-transistor 10 causes the output of linear amplifier 12 to go negative to a voltage level which is a function of the amount of reflectance from a document. A mark may reduce the light intensity to a point which will cause photo-transistor 10 to conduct at a level allowing the output of amplifier 12 to go positive. Signal output from amplifiers 12 is fed to resistors 18 and to mark detection amplifiers 16. Resistors 18 average the outputs of all channels and are fed to summing resistor 20. During a sampling period a holding capacitor 24 is charged to the average of the sum of the outputs of amplifiers 12. At the appropriate time this level is fed to sample and hold amplifier 30 whose output appears at one input of all mark detection amplifiers 16. If all channels have been properly tuned, a mark of a given density incident at one channel will produce the same output signal as a mark of the same density detected by the photo-transistor 10 in any other channel. It is emphasized here that in this prior art device the outputs of the channels are averaged to arrive at a background level and this background level is then used as a reference level in the system. Immediately following the algebraic combination of the reflectance level signals for all channels into an average reflectance level signal, each channel is then compared with this average reflectance level signal. This prior art system works very well but still leaves room for improvement such as contemplated by the present invention.

Figure 2:
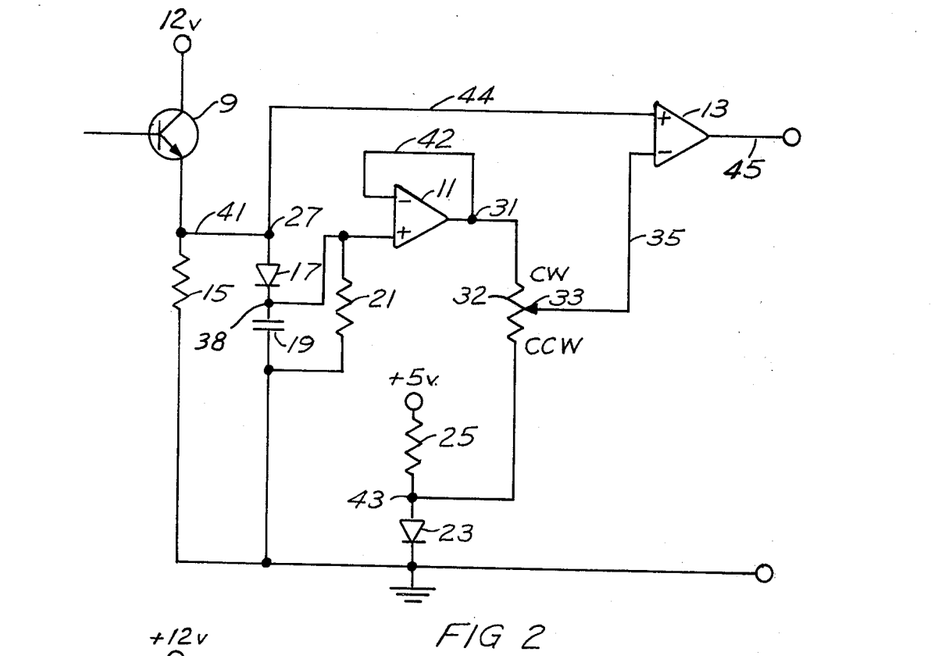
FIG. 2 is a simplified schematic diagram showing the basic operational principles of the invention.

Referring now to FIG. 2, the essential concepts of the invention will be more fully described. When a document to be evaluated enters under the primary sensing optics in a head receiver board, reflected electromagnetic radiation therefrom causes photo-transistor 9 to conduct and develop a voltage across transistor load resistor 15 connected to its emitter. There will thus be developed a positive voltage at the top end of transistor load resistor 15 which will be applied at junction 27 by means of a lead 41. This developed positive voltage will be applied to storage capacitor 19 through diode 17, thus charging capacitor 19 at junction 38 to the voltage appearing at junction 27 minus the diode drop of diode 17 (0.6 volts approximately). This voltage at junction 38 will be the representative "stored white card" voltage of this channel. This "stored white card" voltage is thus representative of signal output that is a function of incident electromagnetic radiation upon a background field in the absence of marks or other objects to be detected. Whenever a mark or object is encountered, the photo-transistor conduction will decrease, however, the storage capacitor 19 will not discharge because of the blocking action of diode 17. This "stored white card" voltage will be an input signal for follower 11 which has been chosen for its high input impedance, so as not to discharge capacitor 19 by any noticeable amount during the time that the conduction of the photo-transistor is decreased by reason of its encountering a mark or object. Input load resistor 21 has been chosen large enough so as to have negligibly small discharging effect on capacitor 19 while the sensor transistor 9 is under the influence of a mark or object, however, resistor 21 will act as a slight load on the input of follower 11 and will permit discharge of capacitor 19 after removal of the card or document thus stopping photo-transistor conduction. Due to the feedback arrangement accomplished through lead 42, the output signal from follower 11 will track its input signal, thus permitting a load to be driven without affecting the input. This output signal will appear at junction 31 and be fed back to the other input of follower 11 by means of the lead 42 thus locking the output signal to the input. This signal is also applied to a threshold adjusting potentiometer 32 which, for the moment, we will assume to have its lower (CCW) end grounded instead of connected to junction 43. If the wiper 33 of the potentiometer 32 is set at the midpoint thereof, the wiper voltage would be half of the "stored white card" voltage and would be applied to the inverting input of comparator 13 by means of lead 35. The voltage applied to the non-inverting input of comparator 13 by means of lead 44 from junction 27 will be whatever voltage has been developed by photo-transistor 9 across transistor load resistor 15. At this point, assuming no mark has been encountered, this would be the original white card voltage as developed before the diode drop of diode 17. There will thus be developed a positive output from comparator 13 indicating no data encountered. If now a mark is encountered, the conduction of photo-transistor 9 will decrease causing a decrease in the voltage applied to the non-inverting input of comparator 13. If the conduction of photo-transistor 9 decreases to the point that the voltage developed at junction 27 is less than that appearing on potentiometer wiper 33, then the voltage as applied by way of lead 44 from junction 27 to the non-inverting input of comparator 13 when compared therein with the voltage applied by way of lead 35 from wiper 33 to the inverting input of comparator 13 will cause the output of comparator 13 to swing negative indicating detection of data. Before proceeding to a specific example, it is to be noted that the connection of the CCW end of potentiometer 32 has been shown connected to junction 43 of resistor 25 and compensating diode 23 in order to compensate for the diode drop caused by diode 17. This will be more fully explained in the specific example explored below.

Still referring to FIG. 2, let us assume a current of 0.5 milliamperes conduction when a document to be evaluated enters the sensing area thus causing that conduction through photo-transistor 9. If transistor load resistor 15 has a value of 10,000 ohms, a voltage of $+5$ volts will be created across it. This $+5$ volts will be effective to charge storage capacitor 19, which we will assume to have a value of 0.022 microfarads in our example, through blocking diode 17. Since 0.022 microfarads is a very small capacitance, it will be fully charged very quickly. An estimate of this charging time may be derived as follows.

Charging time as mentioned is not the time needed to charge the capacitor as limited by an RC time constant. It is, rather, the observed rise time of the charging voltage resulting from the conduction of photo-transistor 9 across transistor load resistor 15. If we multiply the impedance of blocking diode 17 by the capacitance of storage capacitor 19, we would obtain a very low time constant. For example, a quite high estimate of the impedance of blocking diode 17 would be 1000 ohms. One time constant, therefore, is:

$$1 \times 10^3 \text{ ohms} \times 2.2 \times 10^{-8} \text{ farads} = 2.2 \times 10^{-5} \text{ seconds}$$

One time constant will allow a capacitor to charge to within 63.2% of its total capacity and it is generally assumed that a capacitor will be fully charged in five time constants. Thus:

$$2.2 \times 10^{-5} \text{ seconds} \times 5 = 1.1 \times 10^{-4} = 0.11 \times 10^{-3},$$

that is, 0.11 millisecond, and we have the result that the storage capacitor 19 has the capability of charging up fully in 0.11 millisecond or less. The charging voltage from the photo-transistor 9, however, may take up to 2 milliseconds to rise to the full "actual white card" voltage after the leading edge of the document moves under the read head of the sensing optics. It has been determined that this 2 milliseconds is a worst-case situation. A reader selected for its fast rate, used in testing the operation of the invention causes a document to move past the read head such that the first data mark box will reach the read head 3 milliseconds after the leading edge of the document. Therefore, we conclude that the limiting factor in charging the storage capacitor 19 is the rise time of the source voltage developed across transistor load resistor 15 as a result of conduction of photo-transistor 9, and not the RC time constant. That is, the storage capacitor 19 will charge as rapidly as the voltage at the emitter of photo-transistor 9 rises. These times and reactions thereto have been verified as observed by means of a dual trace oscilloscope with storage capabilities. Thus, the capacitor charging time is not a limiting factor and the reader will be ready to sense data well within the required 3 milliseconds.

The storage capacitor 19 will not, however, charge up to the full $+5$ volts due to the diode drop attributable to blocking diode 17 of about 0.6 volts. The charge appearing on storage capacitor 19 will be about $+5$ volts minus 0.6 volts $= +4.4$ volts. This $+4.4$ volts will be our representative "stored white card" voltage. As a mark or object is encountered, the current in photo-transistor 9 will decrease due to the decrease in electromagnetic radiation or light reflected to its sensitive surface. The resultant drop in voltage across transistor load resistor 15 will not cause 0.022 microfarads storage capacitor 19 to discharge due to the blocking action of diode 17. This "stored white card" voltage of $+4.4$ volts will be sensed by signal follower 11 which, because of its very high input impedance, will not discharge storage capacitor 19 by any measurable amount during the time that conduction of photo-transistor 9 is decreased due to crossing a mark on the document or card. Input load resistor 21, say about 1 megohm, has been chosen large enough so as not to have any discharging effect on storage capacitor 19 due to crossing a mark, however, it will act as a slight load on the input of signal follower 11 and will discharge the 0.022 microfarads storage capacitor 19 after a document or card has left the sensing head and photo-transistor conduction has stopped for a relatively long period of time. Since the output of signal follower 11 will track its input, a load may be driven by means of this output without affecting the input thereof. Thus, the output of signal follower 11 is the same as the charge on storage capacitor 19. In a representative test system, it was determined that a conventional 80 column card takes about 90 milliseconds to pass under the read head and that the first data box is encountered about 3 milliseconds after the card enters under the head. Thus, as has been shown, storage capacitor 19 will be fully charged to the "stored white card" voltage well before the first data box is encountered. An observance of the output of signal follower 11 illustrates that after the card leaves the read head, it requires about 15 milliseconds for storage capacitor 19 to become halfway discharged. This is further verified by a consideration of the RC time constant involved in the circuit consisting of 0.022 microfarads storage capacitor 19 and 1 megohm input load resistor 21.

$$1 \times 10^6 \text{ ohms} \times 2.2 \times 10^{-8} \text{ farads} = 2.2 \times 10^{-2} = 22 \times 10^{-3} \text{ sec.}$$

which is 22 milliseconds. Thus, 22 milliseconds is the time constant in question. Reasoning that if one time constant of 22 milliseconds permits discharge of the capacitor by 63.2%, then a 50% discharge should occur in about 15 milliseconds as was observed. The discharge is thus slow enough so that the decrease in photo-transistor conduction due to crossing marks will not cause a measurable discharge in a 0.022 microfarads capacitor. As a result, the "stored white card" voltage, as measured at the output of signal follower 11, will be steady. It is also to be noted that representative card speed is such that a typical mark on these conventional cards is about 0.5 milliseconds or less in width.

Continuing with the example, at the point of the output of signal follower 11 at +4.4 volts for "stored white card" level, it is instructive to illustrate detection of data. If the assumption is also made that the CCW end of threshold adjusting potentiometer 32 is grounded, then, if the wiper 33 is set at midpoint, the wiper voltage of half the "stored white card" voltage, or +2.2 volts, will be applied by means of lead 35 to the inverting input of comparator 13. The voltage applied to the non-inverting input of comparator 13 will be the voltage appearing at junction 27 or +5 volts as applied by means of lead 44. Thus, there will be a positive output on lead 45 from comparator 13 indicating no data encountered by this channel in the head receiver board. If now the conduction of photo-transistor 9 decreases as it crosses a mark, the voltage seen on the non-inverting input of comparator 13 from junction 27 by means of lead 44 will also decrease as the mark is encountered, however, the voltage on the inverting input will remain steady at +2.2 volts. If the conduction of photo-transistor 9 through transistor load resistor 15 decreases to the point that less than +2.2 volts is present on the non-inverting input of comparator 13, the output will swing negative indicating detection of data. About 0.5 milliseconds later we will have passed over the mark and the voltage seen at the non-inverting input of comparator 13 will return to greater than +2.2 volts and cause the output on lead 45 to swing back positive, indicating "white card output" condition again.

During the very brief period of time of about 0.5 milliseconds or less, that the photo-transistor conduction decreased due to encountering the mark, the voltage on the inverting input of comparator 13 remained at a steady +2.2 volts. In our example, we detected data when the "actual white card" voltage dropped from +5 volts to about +2.2 volts, a drop of 2.8 volts or, in other words, there was a 56% decrease in conduction due to the decreased reflectivity of the mark.

$$(5-2.2)/5 \times 100 = 56\%$$

If sometime later, because of head wear, difference in lamp intensity or other degradation of performance, this same photo-transistor only conducts 0.4 milliamperes under "white card" condition, the output of signal follower 11 would be:

$$0.4 \times 10^{-3} \times 10 \times 10^3 = +4 \text{ volts} - 0.6 \text{ volts} = +3.4 \text{ volts}$$

and the voltage at wiper 33 of threshold adjusting potentiometer 32 will be:

$$3.4/2 = +1.7 \text{ volts}$$

With +1.7 volts on the inverting input to comparator 13 and +4 volts on the non-inverting input, the photo-transistor 9 will have to decrease in conduction by 57.5%, that is, $$(4-1.7/4 \times 100 \times 57.5\%$$

in order to force the junction 27 to drop to +1.7 volts to be applied by means of lead 44 to the non-inverting input of comparator 13 and thus indicate detection of data. It would appear that now, a slightly darker mark would be required since more of a decrease in conduction was necessary for data to be detected. This apparent infirmity has been overcome by attaching the CCW end of threshold adjusting potentiometer to a +0.6 volt reference line. This reference is derived, as shown, by attaching a +5 volt source through resistor 25 and compensating diode 23 to ground thus placing the top of compensating diode 23 at junction 43 at +0.6 volts above ground. If now the wiper 33 of threshold adjusting potentiometer 32 is set at midpoint, it will equal one-half of the "actual white card" voltage generated across transistor load resistor 15. We have seen that the voltage at the output of signal follower 11 applied to the CW end of threshold adjusting potentiometer 32 will be 0.6 volts below the "actual white card" voltage as seen at junction 27 and applied to the non-inverting input of comparator 13 because of the diode drop of blocking diode 17. By raising the CCW end of the potentiometer 32 by +0.6 volts, we nullify the 0.6 volt drop caused by diode 17. In this configuration of the circuit, photo-transistor conduction can drop under "actual white card" condition without causing any effect on the percentage of decrease needed to indicate detection of data. That, the CW end of the potentiometer will be at +4.4 volts while the CCW end will be at +0.6 volts, showing a total drop of:

$$4.4 - 0.6 = 3.8 \text{ volts}$$

Now, $$3.8/2 = 1.9,$$

half that drop, and thus the voltage at the wiper 33 will be:

$$4.4 - 1.9 = 2.5$$

which is half of the +5 volts appearing at junction 27.

With this configuration under the decreased conduction conditions considered in which the photo-transistor only conducts 0.4 milliamperes under "white card" conditions, the output of signal follower 11 was seen to be:

$$0.4 \times 10^{-3} \times 10 \times 10^3 = +4 \text{ volts} - 0.6 \text{ volts} = 3.4 \text{ volts}$$

but now the voltage at the wiper 33 of the potentiometer 32 will be determined as:

$$(3.4 - 0.6)/2 = 1.4,$$

half of the drop across the potentiometer, and thus the voltage at the wiper will be:

$$3.4 - 1.4 = 2$$

which is half of the +4 volts appearing at junction 27, that is, 50% of "actual white card" voltage.

To consider an example at the other extreme, assume the photo-transistor conducted 1 milliampere under "white card" conditions, thus developing 10 volts across 10,000 ohm resistor 15. The CW end of threshold adjusting potentiometer 32 will now have +9.4 volts and the CCW end will have +0.6 volts. If the wiper 33 is again set at midpoint, we have:
9.4 − 0.6 = 8.8 volts across potentiometer 32,
8.8/2 = 4.4, that is, half that voltage, and
9.4 − 4.4 = 5 volts at wiper 33,
that is, half of the "actual white card" voltage appearing at junction 27; still half the "stored white card" voltage.

In the present configuration, even if photo-transistor conduction changes the "stored white card" reference, the wiper 33 of threshold adjusting potentiometer 32 will remain at the same percentage of "actual white card" voltage. With wiper 33 set at the midpoint of potentiometer 32, an indication of data detection will be realized every time a mark is encountered which decreases conduction from "actual white card" conditions by 50%. If lighter marks are required to be detected, wiper 33 should be moved toward the CW end of potentiometer 32 so that less percentage of decrease in conduction will be required for comparator 13 in order to indicate detection of data. If darker marks only are to be detected, wiper 33 should be set closer to the CCW end so that a greater decrease in conduction will be necessary before the voltage on the non-inverting input of comparator 13 drops below the voltage on the inverting input as set by potentiometer 32.

Diode 23 and resistor 25, nominally about 220 ohms, also have an additional important function. As the card leaves the read head and photo-transistor conduction drops to zero, the output of comparator 13 will go negative, indicating a black condition. This results because the voltage on the inverting input of comparator 13 still remains. Since photo-transistor conduction has ceased and therefore, there is no voltage by which the storage capacitor 19 may be charged, it will discharge through the resistor 21 and the output of signal follower 11 will also drop toward zero volts as capacitor 19 loses its charge. However, the CCW end of threshold adjusting potentiometer 32 has +0.6 volts on it. There will thus remain about +0.3 volts on the wiper 33 if it is still set at midpoint of potentiometer 32. The inverting input of comparator 13 will be positive by that amount greater than its non-inverting input and therefore its output will remain in the "black" state, or negative, when no card is under the read head.

It has been necessary to refine the circuit still further in order to compensate for the range of conduction of photo-transistors. A numerical example may be in order so as to explain this further refinement. It has been found that a very badly worn head may cause a phototransistor to conduct only about 0.2 milliamperes under "white card" conditions. No channel has yet been encountered in practice in which the photo-transistor conducted less than 0.2 milliamperes. A conduction of 0.2 milliamperes will derive a voltage of 2 volts across a 10,000 ohm load resistor. It has been found that this is a sufficient voltage with which to work. The problem is found at the other end of the spectrum. That is, a problem presents itself upon the use of a 10,000 ohm load resistor on the emitter of a photo-transistor when the circuit is used in a new reader with very good phototransistor conduction. Some of these new channels may conduct as much as 1.8 milliamperes under "white card" conditions. Such a result requires 18 volts to be dropped across the 10,000 ohm emitter resistor and this is impossible with a +12 volt supply. The photo-transistor in such a situation is in saturation and can thus pass over a mark without even decreasing the voltage on the 10,000 ohm load resistor. If it is attempted to use a 5,000 ohm load resistor to thus generate +9 volts when 1.8 milliamperes is conducted, the transistor is not saturated under "white card" condition on new readers and the solution is workable under these conditions. However, if the 5,000 ohm load resistor were to be used with a very worn head that only caused 0.2 milliamperes conduction, only 1 volt would be generated to operate the circuit and that voltage is too low to be reliable in operating the circuit.

Figure 3:
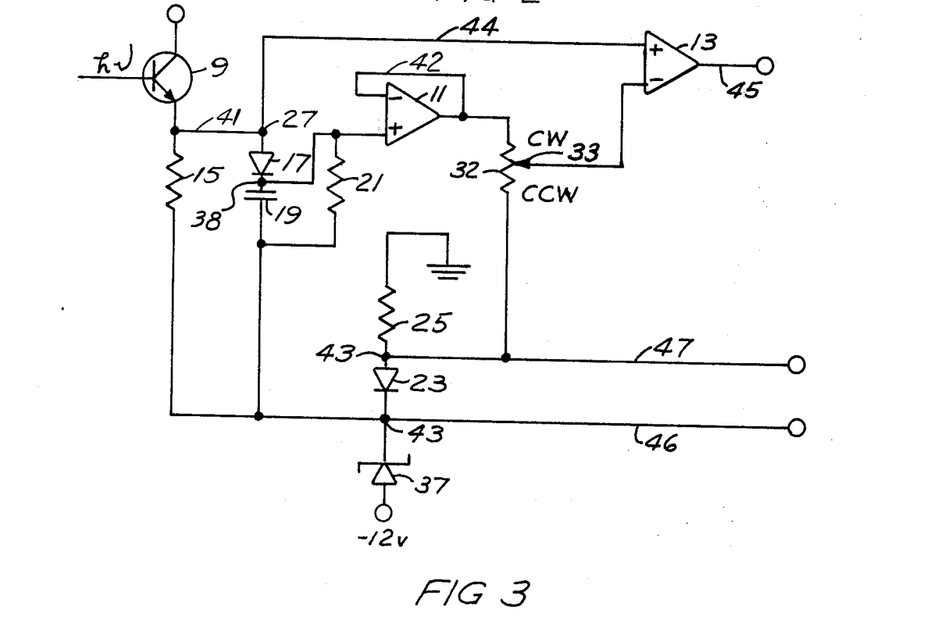
FIG. 3 is a schematic diagram incorporating an improvement but retaining the original concept of the invention.

Referring now to FIG. 3, a solution to the problem posed in the above paragraph is illustrated. Instead of utilizing a +12 volt-to-ground power supply, a +12 volt to −12 volt source has been shown. A 3.3 volt Zener diode 37 creates a reference voltage at −8.7 volts on lead 46 and the top of diode 23 is now shown at −8.1 volts on lead 47 while resistor 25 is connected to ground instead of to a +5 volt source. With this circuit configuration, the photo-transistor 9 will not be in saturation when conducting 1.8 milliamperes into a 10,000 ohm load for an 18 volt drop. The lower end of transistor load resistor 15 is held at −8.7 volts by the supply voltage Zener, therefore, $$-8.7 + 18 = 9.3 \text{ volts}$$

is the voltage that will be developed at the other end of resistor 15 and is the voltage at the emitter of phototransistor 9 under these conditions.

For the remainder of our discussion, all voltage measurements will be considered as made in respect to the −8.7 volt line, which shall be referred to as "common." This line has been denoted by the numeral 46. As a warning, in making measurements on a circuit connected in this configuration, if the common lead of an oscilloscope is to be placed on this −8.7 volt line, first it should be verified that the instrument is floating and not grounded to equipment ground. The 3.3 volt Zener diode 37 has been used to place the common line 46, 3.3 volts above the −12 volt supply in order that the operational amplifiers 11 and 13 do not ever have input voltages or output voltages that meet the negative power supply voltage. If the circuit was referenced to −12 volts as common, the output of signal follower 11 would be required to come very close to the negative 12 volt supply when the 0.022 capacitor 19 was completely discharged, thus causing saturation of the output of the circuit. Additionally, it has been found that operational amplifiers may have a tendency to give false outputs when their inputs are brought this close to supply voltages. By referencing the circuit to −8.7 volts, neither the positive nor negative supply voltages is approached.

In its present configuration the circuit now sees a larger voltage range over which to operate. For all intents and purposes, the supply voltages are 20.7 volts (8.7+12) instead of 12. The photo-transistors 9 will not be harmed as these components are operational for up to 40 volts.

Figure 6:
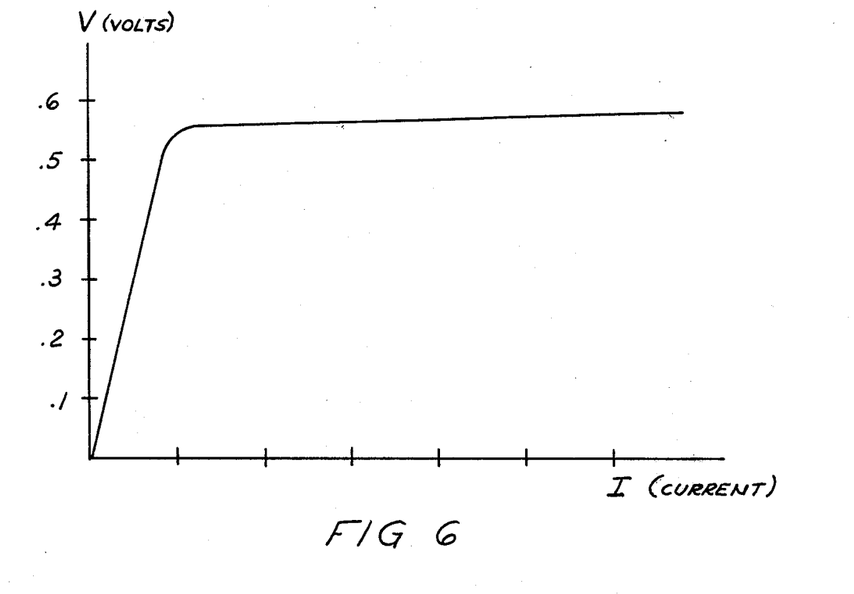
FIG. 6 is a typical diode response curve of voltage versus current.

A second major problem was encountered with respect to the 0.6 volts applied to the CCW end of the threshold adjusting potentiometer 32. That voltage was employed in order to keep the wiper of potentiometer 32 at a desired percentage of "actual white card" voltage as that voltage changed. In theory, diode 23 compensated for the fact that the output of signal follower 11 was 0.6 volts lower than "actual white card" voltage because of the 0.6 volt diode drop across diode 17. In actual operation, the voltage drop across diode 17 is not 0.6 volts, but is only about 0.2 volts. Diode 17 is a silicon diode which is usually considered to have a 0.6 volt junction voltage drop but such a condition obtains only when sufficient current flows. Examination of the voltage versus current plot of FIG. 6 illustrates this point. Only when the current reaches a certain level is it great enough to reach what is called the "knee" of the curve and thus cause the voltage across it to remain at approximately 0.6 volts. From this point, as current increases, only a slight increase in voltage is noted due to the internal forward resistance of the diode. However, in our application, we are passing very little current through the diode. The only loading factors on that diode are the input impedance of signal follower 11 which, as we have said, is very high, the leakage of the 0.022 microfarads capacitor 19, which is very low and therefore offers a very high impedance, and the 1 megohm load resistor 21. This 1 megohm load resistor 21 draws most of the current from diode 17 but is still so small that the diode only drops the voltage about 0.2 volts. This has been verified by comparing the "actual white card" voltage on the emitter of photo-transistor 9 to the voltage on the output of signal follower 11. The voltage on the output of signal follower 11 has been observed to be 0.2 volts lower rather than the 0.6 volts as had been previously described. This result indicates a lack of linearity in the circuit since white card voltages will change unless we now establish the CCW end of potentiometer 32 at 0.2 volts instead of 0.6 volts.

Figure 4:
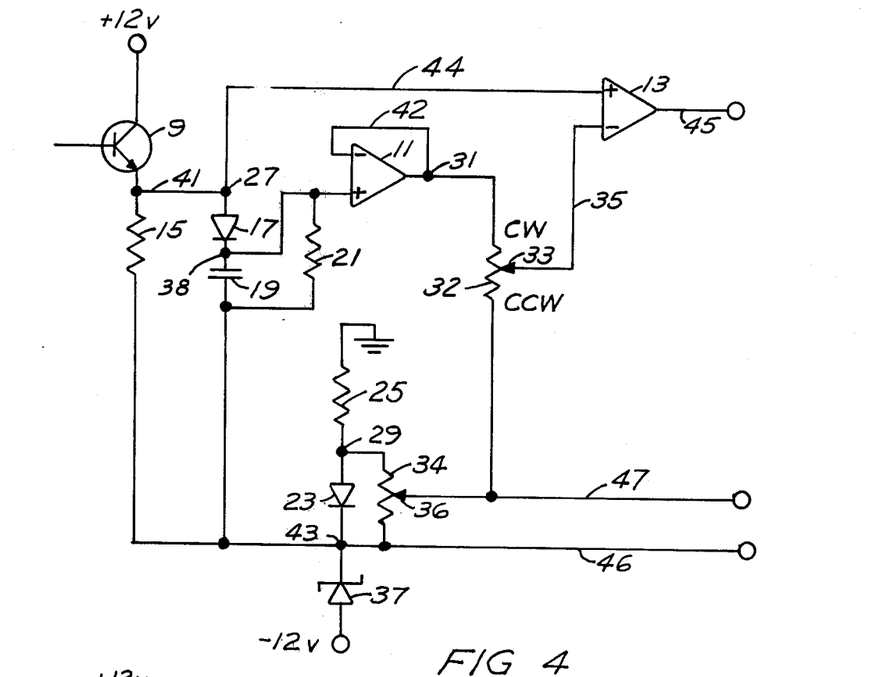
FIG. 4 is a schematic diagram showing further refinements to the concept of FIG. 2.

In our test circuit, as shown in FIG. 4, a 100 ohm diode compensating potentiometer 34 was connected to the −8.1 volts junction between the resistor 25 and diode 23 and the −8.7 volts common line of our circuit. This potentiometer 34 can then be adjusted so that its wiper voltage is about 0.2 volts above the −8.7 volts. Once the required resistances are determined, potentiometer 34 may be replaced by fixed resistors since once set it will not require changing. Since there now appears only 0.2 volts with respect to −8.7 common at the CCW end of threshold adjustment potentiometer 32 when a card or document leaves the read head and the 0.022 microfarads capacitor 19 discharges thus making the output of signal follower 11 and the CW end of potentiometer 32 at zero volts, there will only be about 0.1 volt on wiper 33 to be applied by means of lead 35 to the inverting input of comparator 13. A practical operational amplifier may have more than 0.1 volt input offset voltage and, under that condition, the output of comparator 13 will not be negative as it should be but rather, it will be positive. This condition may be further aggravated by the failure of the photo-transistor to drop to zero milliamperes conduction. There may be a slight residual conduction due to internal leakage or some conduction may remain due to light being reflected from card dust lying under the head or even from a slight scratch at the end of the optics. In any case, very little conduction of the photo-transistor would be needed to apply the slightly over 0.1 volt on the non-inverting input of comparator 13 so as to result in an erroneous output.

Figure 5:
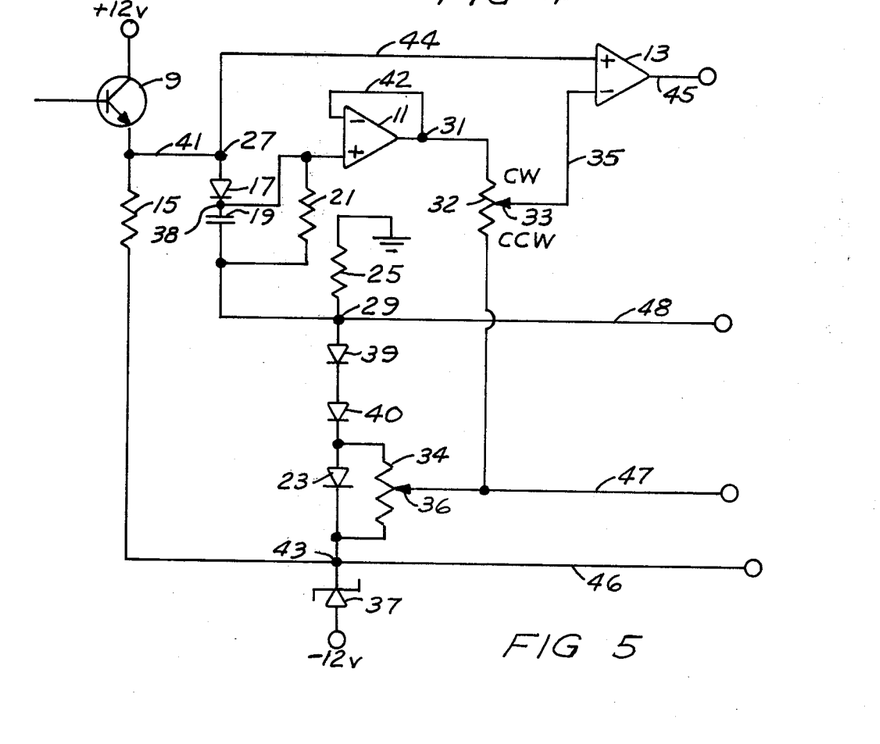
FIG. 5 is a simplified schematic diagram illustrating the final refinements made to the circuit, thus showing a channel of the mark sense detector as presently implemented.

Referring now to FIG. 5, it will be noted that signal follower 11 has been biased up so that it will not drop below 1.8 volts on its output. It was determined that no channel gets lower than 0.18 milliamperes conduction under white card conditions. If it should, by that time heads are long overdue for replacement. It was thus decided to bias up signal follower 11 so that it never drops below 1.8 volts on its output as shown. In this configuration under the black, or no card, condition, the output of comparator 13 always remains correct since there will be maintained about +0.9 volts on the inverting input of comparator 13. If the voltage on the non-inverting input of comparator 13 does not drop all the way down to zero volts with no card, the circuit will still operate correctly as long as the voltage goes below 0.9 volts. Holding the output of signal follower 11 at 1.8 volts has been accomplished by adding two more diodes 39 and 40 in series with diode 23. The total voltage across these three diodes is 1.8 volts. In this case, each diode will have a 0.6 volt drop across it since the 220 ohm resistor 25 will allow about 30 milliamperes conduction through the diodes. The 1 megohm resistor 21 and the 0.022 microfarads capacitor 19 will then be connected to this 1.8 volt line at junction 29 to establish a minimum discharge voltage on a lead 48 and allow signal follower 11 to go no lower than 1.8 volts at its output. In normal operation the output of signal follower 11 will still follow at 0.2 volts below the white card voltage generated by conduction of photo-transistor 9. The only requirement is that photo-transistor 9 must conduct at least 0.2 milliamperes with a white card under the head and, as has been noted, none of the most worn heads in the most used readers has been found to conduct lower than this.

Thus there has been described an improvement to optical mark sense readers showing constant percentage sensitivity under conditions of varying conduction of the photo-transistor. Great improvements in reliability, flexibility, maintainability, and operability have been provided through the novel advantages of the invention.

It is pointed out that although the present invention has been shown and described with reference to particular embodiment, nevertheless various changes and modifications obvious to one skilled in the art to which the invention pertains are deemed to lie within the purview of the invention.

What is claimed and desired to be secured by Letters Patent of the United States is:

1. In a multichannel optical data detecting system in which detection is accomplished in each channel by comparing electromagnetic radiation introduced into optics in the absence of objects to be detected to that electromagnetic radiation introduced into optics when objects to be detected are encountered by said optics, the improvement in each channel comprising:
    means for developing a first signal as a function of incident electromagnetic radiation upon a background field in the absence of said objects to be detected;
    means for deriving second signals as a function of said first signal and the introduction into said optics of objects to be detected;
    means to store and hold increases to said first signal;
    means to prevent attenuation of said stored first signal;
    high impedance input means responsive to said first signal and operative to furnish said first signal to subsequent circuitry so as to have negligible effect on said first signal;
    threshold adjusting means furnishing a threshold level and responsive to said high impedance input means;
    signal compensating means effective to cooperate in the control of said threshold adjusting means;
    means for comparing said threshold level with signal level developed by the introduction of objects to be detected into said optics.

2. The system of claim 1, wherein said means for developing a first signal as a function of incident electromagnetic radiation upon a background field in the absence of said objects to be detected comprises a photo-transistor and an associated load resistor.

3. The system of claim 1, wherein said threshold adjusting means responsive to said high impedance input means comprises a potentiometer.

4. The system of claim 1, wherein said means to store and hold increases to said first signal is a capacitor.

5. The system of claim 1, wherein said means to prevent attenuation of said stored first signal is a blocking diode.

6. The system of claim 1, wherein said means for deriving second signals as a function of said first signal and the introduction into said optics of objects to be detected comprises:
    a photo-transistor;
    a load resistor connected to said photo-transistor so as to develop a voltage as a result of current conduction in said photo-transistor;
    a diode responsive to and furnishing signal resulting from said voltage developed as a result of current conduction in said photo-transistor;
    a follower responsive to said signal furnished by said diode and operative to furnish said signal to subsequent circuitry with negligible effect upon said diode;
    a potentiometer responsive to said follower; and
    a comparator responsive to said potentiometer and to said voltage developed by said load resistor as a result of current conduction in said photo-transistor in a manner so as to compare them.

7. The system of claim 1, wherein said high impedance input means responsive to said first signal and operative to furnish said first signal to subsequent circuitry so as to have negligible effect on said first signal comprises a linear operational amplifier having its output signal fed back directly to its inverting input and accepting said first signal upon its non-inverting input.

8. The system of claim 1, wherein said signal compensating means effective to cooperate in the control of said threshold adjusting means comprises a resistor/diode network operative to furnish supply voltage levels to the system.

9. A multichannel optical mark sense detector wherein each channel comprises:
    a photo-transistor circuit comprising a photo-transistor and a load resistor responsive to incident electromagnetic radiation;
    a threshold circuit comprising a blocking diode, a capacitor and a load resistor responsive to signal output from said photo-transistor circuit and including storage means therefor;
    an operational amplifier configured as a signal follower circuit responsive to a threshold level as determined by said threshold circuit;
    a threshold adjusting potentiometer circuit responsive to signal output from said signal follower;
    a comparator responsive to signal output from said threshold adjusting potentiometer circuit and said photo-transistor circuit; and
    reference supply voltages furnishing reference voltages to each of said circuits.

10. A method of detecting marks by means of a multichannel mark sense detector comprising in each channel the steps of:
    introducing electromagnetic radiation to a means for developing an output signal as a function of the incident electromagnetic radiation;
    generating a threshold level in response to signal output from said means for developing an output signal as a function of the incident electromagnetic radiation;
    storing said generated threshold level wherein the step of storing said generated threshold level comprises the step of charging a storage capacitor;
    tracking said stored threshold level wherein the step of tracking said stored threshold level comprises the steps of applying said threshold level to be tracked to one input of an operational amplifier and applying the output therefrom to another input of said operational amplifier;
    adjusting said stored threshold level wherein the step of adjusting said stored threshold level includes the step of re-positioning the wiper of a potentiometer; and
    comparing said adjusted threshold level with said generated threshold level wherein the step of comparing said adjusted threshold level with said generated threshold level includes the steps of applying the signal at the wiper of said potentiometer to one input of an operational amplifier and applying said generated threshold level to another input of said operational amplifier.

* * * * *

UNITED STATES PATENT OFFICE
CERTIFICATE OF CORRECTION

Patent No. 4,162,408　　　　　　Dated July 24, 1979

Inventor(s) Emmert S. Hansen

It is certified that error appears in the above-identified patent and that said Letters Patent are hereby corrected as shown below:

Column 8, line 38:　"(4 - 1.7 /4" should read -- (4 - 1.7) / 4 --

Column 8, line 38:　" x 57.5% " should read -- = 57.5% --

Signed and Sealed this

Twenty-third Day of October 1979

[SEAL]

Attest:

RUTH C. MASON
Attesting Officer

LUTRELLE F. PARKER
Acting Commissioner of Patents and Trademarks